United States Patent [19]

Dickmander

[11] Patent Number: 5,796,259
[45] Date of Patent: Aug. 18, 1998

[54] METHODS AND APPARATUS FOR DETECTION OF FAULT DIRECTION

[75] Inventor: David L. Dickmander, Cary, N.C.

[73] Assignee: ABB Power T&D Company, Inc., Raleigh, N.C.

[21] Appl. No.: 710,315

[22] Filed: Sep. 16, 1996

[51] Int. Cl.$^6$ ................................................. G01R 31/08
[52] U.S. Cl. .................... 324/524; 324/522; 324/108; 361/82
[58] Field of Search ............................ 324/512, 522, 324/524, 108; 361/44, 60, 65, 79, 82; 364/483

[56] References Cited

U.S. PATENT DOCUMENTS

| | | | |
|---|---|---|---|
| 4,251,766 | 2/1981 | Souillard | 324/521 |
| 4,352,137 | 9/1982 | Johns | 361/82 |
| 4,591,992 | 5/1986 | Yamaura | 364/483 |
| 4,731,689 | 3/1988 | Nimmersjo et al. | 324/522 X |
| 4,868,704 | 9/1989 | Cavero | 361/80 |
| 5,572,138 | 11/1996 | Nimmersjo | 324/522 |

*Primary Examiner*—Glenn W. Brown
*Attorney, Agent, or Firm*—Woodcock Washburn Kurtz Mackiewicz & Norris LLP

[57] ABSTRACT

Apparatus and methods for detecting the direction of a fault in relation to a switch connected between a source and a load are shown to include a voltage sampler for generating samples of the voltage during first and second power cycles. A current sampler generates samples of the current during first and second cycles. A first comparator compares the current samples from the first cycle to the current samples from the second cycle and determines the sign of the difference between the samples. A second comparator compares the sign of the voltage from the first cycle to the sign of the current difference determined by the first comparator and provides an indication of fault direction in relation to such comparison. The apparatus also includes a fault inception determiner, for providing a fault inception indication in relation to the voltage samples from the first and second cycles. The fault inception determiner is a comparator which compares the voltage samples from the first cycle to the voltage samples from the second cycle and determines the sign of the difference between the samples. A synchronizer, such as a phase locked loop must be used to synchronize the generation of the voltage and current samples at approximately the same points during each system cycle.

5 Claims, 3 Drawing Sheets

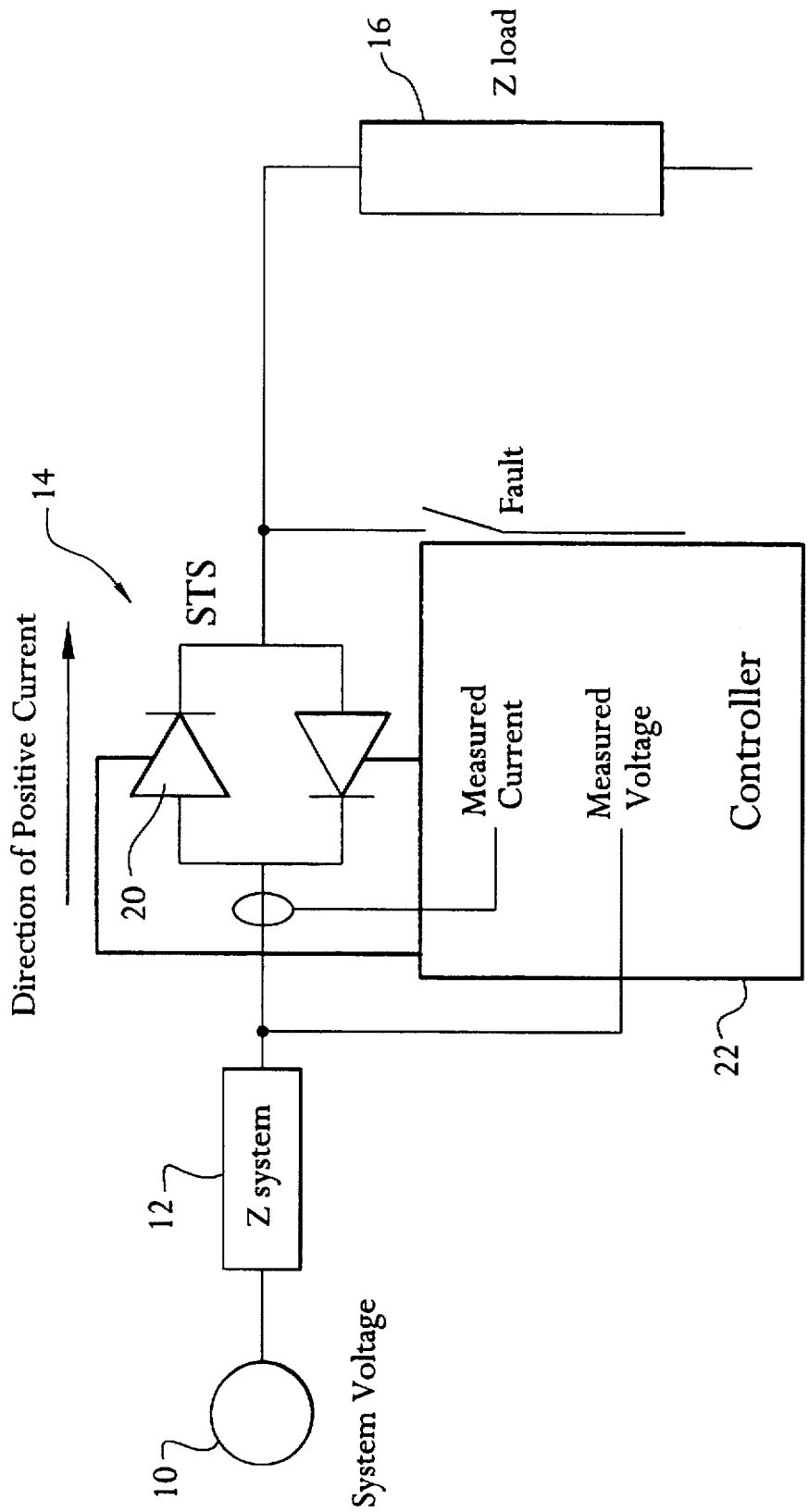
FIG. 1 System Diagram

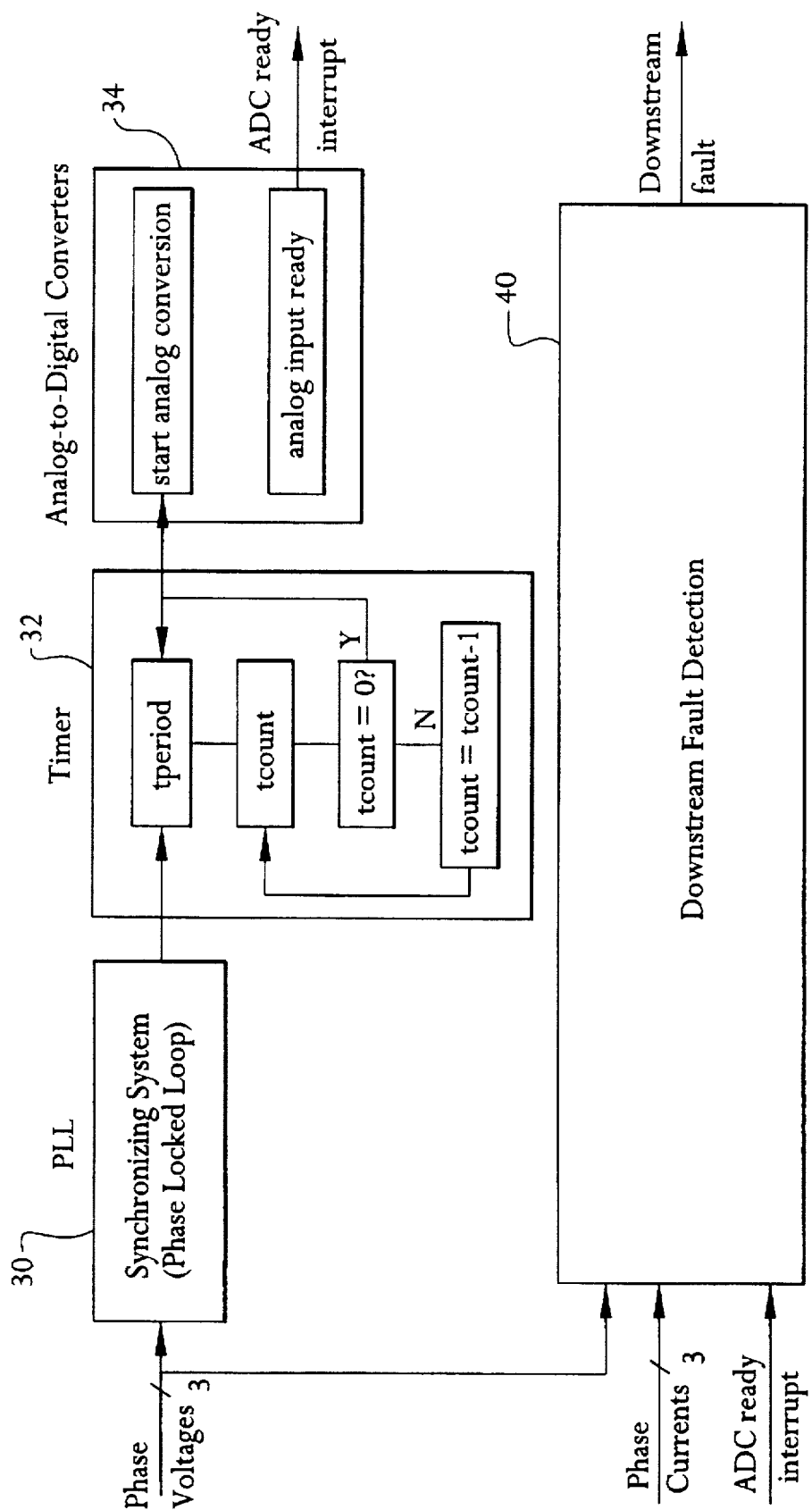
FIG. 2 Overall System Diagram Including Synchronizing System

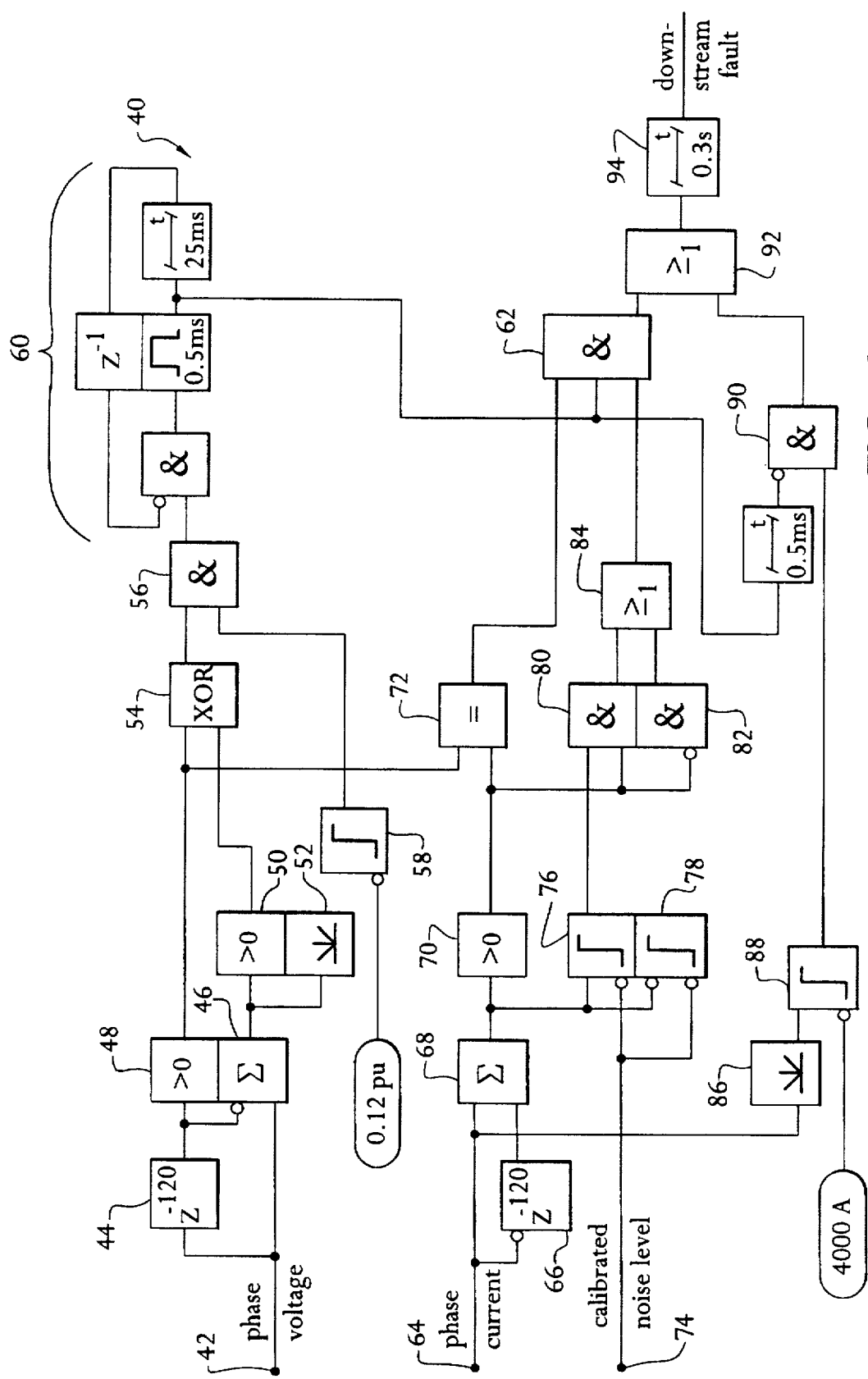
FIG. 3 Downstream Fault Detection ns but not all, of the listed complicating factors. Adapting detection algorithms to account for all of the complicating factors can force an extension of the detection time beyond 2 ms to a half system cycle or more. This extended detection time forces delay of the transfer, resulting in unacceptably long transfer times.

METHODS AND APPARATUS FOR DETECTION OF FAULT DIRECTION

FIELD OF THE INVENTION

The present invention relates generally to the field of detecting fault direction and more particularly, to methods and apparatus for detection of fault direction in power distribution systems.

BACKGROUND OF THE INVENTION

Silicon transfer switches or static transfer switches (STS) are known in the art. These switches are designed to provide an uninterrupted AC power source to facilities where any interruption in power could result in significant financial loss, as well as catastrophic human loss. Such facilities include industrial plants that perform continuous manufacturing operations, hospitals, airports, military bases and data communications centers, where an uninterrupted power supply is critical to facility operation.

Generally, the STS device comprises two power source switch boxes, wherein the preferred power source is input into one of the switch boxes and an alternative power source is input into the other switch box. Inside each switch box is an arrangement of solid state switching devices, with the electrical components of each switch box being connected to controller electronics housed in a controller box (generally positioned between the switch boxes). The solid state switching devices in each box are designed to provide fast transfer of the load from the preferred power source to the alternative power source in the event of a disturbance or voltage sag.

The controller electronics in the controller box provides the necessary input and output information to turn the switch device in one of the switch boxes to an "on" status, while leaving the switch device in the other box in an "off" status so that the power source flowing into the "on" switch is supplied to the load. Typically, transfer from the preferred AC power source to the alternate AC power source will occur within a fraction of a power cycle.

For several reasons, it is desirable to prevent the transfer operation if the fault is located "downstream" (on the load side) of the STS. However, the high transfer speed of STS devices results in rather stringent requirements for fault location detection. Generally, fault location detection must be made in under 2 ms. Determining the exact location distance of a fault within this time frame is not necessary so long as the direction of the fault, either upstream or downstream, is determined.

Reliable detection of fault direction is complicated by various factors, including transient DC offsets, harmonics in the load current and system voltages, discharge of power factor correction capacitors into the fault, leading or lagging power factor loads, and large motor loads. With these factors in mind, it is possible to develop various fault direction detection algorithms which are reliable for sinusoidal current and voltage waveforms and which work reliably for some, but not all, of the listed complicating factors. Adapting detection algorithms to account for all of the complicating factors can force an extension of the detection time beyond 2 ms to a half system cycle or more. This extended detection time forces delay of the transfer, resulting in unacceptably long transfer times.

Accordingly, a need still exists for methods and apparatus for detecting fault direction which are not affected by the complicating factors.

SUMMARY OF INVENTION

The above described problems are resolved and other advantages are achieved in an apparatus and methods for detecting the direction of a fault in relation to a switch connected between a source and a load. The apparatus and methods are shown to include a voltage sampler for generating samples of the voltage. A current sampler generates samples of the current. A first comparator compares the current samples from the previous power cycle to the current samples from the present cycle and determines the sign of the difference between the samples. A second comparator compares the sign of the voltage from the previous cycle to the current sign determined by the first comparator and provides an indication of fault direction in relation to such comparison. The apparatus also includes a fault inception determiner, for providing a fault inception indication in relation to the voltage samples from the previous and present cycles. The fault inception determiner is a comparator which compares the voltage samples from the previous cycle to the voltage samples from the present cycle and determines the sign of the difference between the samples. A synchronizer, such as a phase locked loop must be used to synchronize the generation of the voltage and current samples at approximately the same points during each system cycle.

BRIEF DESCRIPTION OF THE DRAWINGS

The present invention will be better understood, and its numerous objects and advantages will become apparent to those skilled in the art by reference to the following detailed description of the invention when taken in conjunction with the following drawings, in which:

FIG. 1 is a diagrammatic view of a system incorporating an STS device constructed in accordance with the invention having a controller for detecting fault direction;

FIG. 2 is a diagrammatic view of a portion of the controller depicted in FIG. 1, for generating synchronous voltage and current samples; and FIG. 3 is a block diagram of a portion of the controller depicted in FIG. 1 which processes the samples generated in connection with FIG. 2 to quickly determine fault direction in accordance with the present invention.

DETAILED DESCRIPTION OF THE INVENTION

Referring to FIG. 1, there is shown an AC source 10 connected to an impedance system 12. It will be understood that impedance system 12 generally represents a power distribution or power transmission system. An STS device 14 has been connected between system 12 and a load 16. STS 14 operates to either connect or disconnect load 16 from source 10. STS 14 is shown to include a solid state switch 20 and a controller 22. Switch 20 can take any one of several forms, such as a series of thyristor pairs connected antiparallel. However, the exact design of switch 20 can take many forms and is not necessary for an understanding of the invention. Accordingly, it will not be discussed in any greater detail herein.

Controller 22 is connected to switch 20 and will operate to "open" switch 20 upon the detection of any fault on the source side of STS 14. A load side fault, for which switch 20 must remain closed, is represented diagrammatically in FIG. 1 as a switch. Controller 22 measures the current and voltage at the input to switch 20. As will be described in connection with FIGS. 2 and 3, these measurements are used to quickly determine the direction of a fault. If a fault is determined to be downstream, as would be present if the "fault switch" shown in FIG. 1 were closed, controller 22 would preclude switch 20 from opening, i.e., would preclude the source attached to load 16 from being switched from source 10.

Generally, the invention determines fault direction based on observations of the voltage and current conditions at the fault inception instant. More particularly, the invention determines that fault direction is downstream if at the fault instant the polarity of the current deviation between the present cycle and the prior cycle is in the same direction as the measured voltage. For example, if the voltage has a positive polarity, a downstream fault will cause the present cycle current to deviate from the prior cycle current in the positive direction. If the voltage has a negative polarity, a downstream fault will cause the present cycle current to deviate from the prior cycle current in the negative direction.

Another way to explain these relationships is as follows:

For voltage and current having the same polarity, downstream faults will result in the initial current magnitude at the fault instant being increased as compared to the current recorded during the previous cycle. Upstream faults will result in the initial current magnitude at the fault instant being decreased as compared to the current during the previous cycle.

For voltage and current having opposite polarity, downstream faults will result in the initial current magnitude at the fault instant being decreased as compared to the current recorded during the previous cycle. Upstream faults will result in the initial current magnitude at the fault instant being increased as compared to the current during the previous cycle.

As may be appreciated from the above, detecting fault direction in accordance with the invention involves determining the direction of the current deviation at the fault inception instant as compared to the current recorded one cycle earlier. Such determinations will require isolation of the fault instant and determination of the polarity of the current deviation at the fault instant.

As will be explained, isolation of the fault instant is achieved by detection of a sudden reduction in voltage magnitude at STS 14. Positive detection of a fault then activates current deviation checks. In order to make valid comparisons between present data samples and samples recorded one power cycle earlier and to give sufficient information (bandwidth) for capacitor discharge phenomenon two conditions are necessary, namely, synchronous sampling and a high sample rate.

Referring to FIG. 2, synchronous sampling is achieved via a phase locked loop (PLL) 30. PLL 30 calculates at each instant the time to the next sample. This calculated time interval ("tperiod") is written to a timer 32, which, using a counter, counts down "tperiod" and generates an interrupt at the desired sample instants. In this way, an integer number of samples occurs for each cycle. In the preferred embodiment, for use in a utility application, the nominal sampling rate is 7.2 kHz yielding 120 samples per 60 Hz cycle. Samples so collected are provided to direction determination logic 40 for determining the fault direction.

Referring now to FIG. 3, logic 40 is depicted in greater detail. It will be understood that logic 40 can be implemented in various forms. It is preferred for logic 40 to be implemented in software running on a computer or microprocessor (not shown), however, it will be readily apparent that logic 40 could be implemented in a variety of ways, i.e., firmware or digital circuitry.

It will be recalled that in addition to synchronizing samples it is important to determine fault occurrence. To this end voltage samples are provided at 42 to a one cycle delay 44 and to summer 46. Delay 44 serves to delay samples for one cycle. The output of delay 44 is provided to sign determining device 48 and summer 46 where it is inverted. The output of device 48 is either logic high or low depending on whether the sign of a sample is positive or negative. Summer 46 determines the difference between the present current sample and the sample from the prior cycle and outputs this difference to sign determining device 50 and absolute value device 52. The output of sign determining device 50 and sign determining device 48 are provided to exclusive OR gate 54. If the outputs of devices 48 and 50 are different, indicating a fault, a logic high signal is provided to AND gate 56. The output of absolute value device 52 is compared in comparator 58 to a 0.12 PU threshold level. This comparison is made to prevent any difference between present and prior samples due to noise from giving a fault indication. The output of comparator 58 is provided to AND gate 56. If the difference in magnitude between the present and prior voltage samples exceed the noise threshold and the signs of the prior voltage sample and the sign of the difference are different, AND gate 56 provides a logic high signal to fault detection indicator 60. Indicator 60 provides a 0.5 ms signal to AND gate 62. A 25 ms delay is built into indicator 60 as an interlock to avoid multiple fault inception indications which could result from capacitor discharge, etc.

While the voltage samples are being analyzed to determine fault inception, current samples are input at 64 and provided to a one cycle delay 66 and summer 68. Summer 68 determines the difference between the present current value and the current value during the prior cycle, which difference is provided to sign determining device 70. The output of sign determining device 70 and sign determining device 48 are provided to device 72 which determines whether the signs are the same. That is, whether the polarity of the voltage sample from the prior cycle is the same as the polarity of the difference between the present current sample and the prior current sample. If the signs are the same, the fault is downstream and a logic high signal is provided to AND gate 62. The only consideration remaining to determine whether a fault is indeed downstream is whether noise has distorted the current values.

A calibrated noise level is provided at 74 and to comparators 76 and 78. Comparators 76 and 78 compare the noise signal to the output of summer 68. In one instance, comparator 78, the output of summer 68 is inverted. The output of sign determination device 70 and comparators 76 and 78 are provided to AND gates 80 and 82. The output of AND gates 80 and 82 are ored in OR gate 84. If either input to OR gate 84 is logic high, gate 84 provides an output indicating that the calibrated noise level has been exceeded.

It is noted that the present current value is also provided to absolute value device 86 for comparison in comparator 88 to a 4.000A reference. Current exceeding this level is a positive indication that a downstream fault has occurred and a logic high signal is provided by AND gate 90. The 4.000A level is chosen based on an expected nominal operating current of 600A. The outputs from AND gates 62 and 90 are provided to OR gate 92, whose output is provided to latch 94. It will be appreciated that latch 94 serves to provide a 0.3 second output upon receiving an appropriate input.

It should be appreciated from the above that XOR gate 54 provides an indication of fault inception based on the following polarity conditions:

present voltage sample minus prior voltage sample yields a negative sign and the sign of the prior voltage sample was positive; or present voltage sample minus prior voltage sample yields a positive sign and the sign of the prior voltage sample was negative.

It should also be appreciated from the above that device 72 provides an indication of a downstream fault based on the following polarity conditions:

present current sample minus prior current sample yields a positive sign and the sign of the prior voltage sample was positive; or present current sample minus prior current sample yields a negative sign and the sign of the prior voltage sample was negative.

It is further noted that the process described in FIG. 3 introduces a small delay for fault inception instants near the voltage zero crossing. The width of this "blind" zone is determined by the setting used for the voltage deviation detection for which values ranging from 8% to 12% are preferred. The 12% value was chosen to avoid misoperations for certain types of upstream faults, and gives a blind zone of ±6.9 degrees at each voltage crossing. For faults which occur during these blind zones, the detection is delayed by at most 13.8 degrees, or 0.638 ms. Adding a detection time of 0.5 ms to this value, the described process has a maximum theoretical delay of 1.14 ms for faults in the blind zones. This delay is well within the 2 ms detection requirement.

While the invention has been described and illustrated with reference to specific embodiments, those skilled in the art will recognize that modification and variations may be made without departing from the principles of the invention as described herein above and set forth in the following claims.

What is claimed is:

1. Apparatus for detecting the direction of a fault in relation to a switch connected between a source and a load, wherein said source is generating alternating voltage and current at a cycle rate, said apparatus comprising:

a voltage sampler for generating samples of the voltage during a first cycle;

a current sampler for generating samples of the current during said first cycle and during a second cycle;

a first comparator for comparing the current samples from said first cycle to the current samples from said second cycle and for determining the polarity of the difference between said samples;

a second comparator for comparing the polarity of the voltage from said first cycle to the polarity of said difference determined by said first comparator and for providing an indication of fault direction in relation to such comparison.

2. The apparatus of claim 1, wherein said voltage sampler further generates samples of the voltage during said second cycle, said apparatus further comprising a fault inception determiner, for providing a fault inception indication in relation to the voltage samples from said first and second cycles.

3. The apparatus of claim 2, wherein said fault inception determiner comprises a third comparator for comparing the voltage samples from said first cycle to the voltage samples from said second cycle and for determining the sign of the difference between said samples.

4. The apparatus of claim 1, further comprising a synchronizer for synchronizing the generation of said voltage and current samples at approximately the same points during each system cycle.

5. The apparatus of claim 4, wherein said synchronizer comprises a phase locked loop.

* * * * *